United States Patent [19]

Watanabe

[11] 4,057,822

[45] Nov. 8, 1977

[54] CHANNEL TYPE PHOTO-ELECTRIC ENERGY TRANSDUCER

[75] Inventor: Kenryo Watanabe, Tenri, Japan

[73] Assignee: Sharp Kabushiki Kaisha, Osaka, Japan

[21] Appl. No.: 605,843

[22] Filed: Aug. 19, 1975

[30] Foreign Application Priority Data

Aug. 22, 1974 Japan .................................. 49-96712

[51] Int. Cl.² ............................................. H01L 29/34
[52] U.S. Cl. ........................................ 357/52; 357/30; 357/53
[58] Field of Search ............................. 357/52, 53, 30

[56] References Cited

U.S. PATENT DOCUMENTS

| 3,405,329 | 10/1968 | Loro | 317/234 |
| 3,601,668 | 8/1971 | Daten | 317/234 R |
| 3,978,511 | 7/1973 | Digoy | 357/30 |

Primary Examiner—Martin H. Edlow
Attorney, Agent, or Firm—Birch, Stewart, Kolasch & Birch

[57] ABSTRACT

During the growth of an oxide on the surface of a P-type silicon semiconductor wafer, thermal oxidation of the semiconductor surface produces an N-channel region near the silicon/silicon dioxide interface by the conductivity inversion behavior, thereby establishing a PN junction barrier therebetween. By a photo-lithographic etching process, a heavily doped P-type diffusion region (that is, P+ region) operatively associated with the P-type semiconductor wafer, is disposed at the peripheral portion of the semiconductor wafer to surround the PN junction barrier and shield the same against the outside ambient atmosphere. Besides, a heavily doped N-type diffusion region (N+ region) is made up inside of the heavily doped P-type region in a manner to describe a closed loop. An electrode assembly includes metal contact layers having extensions over a dioxide which has been disposed between the P+ region and the N+ region during the fabrication procedure, so that the overlying electrode structure precludes the formation of an undesired N-channel region between the P+ and N+ diffusion regions.

4 Claims, 7 Drawing Figures

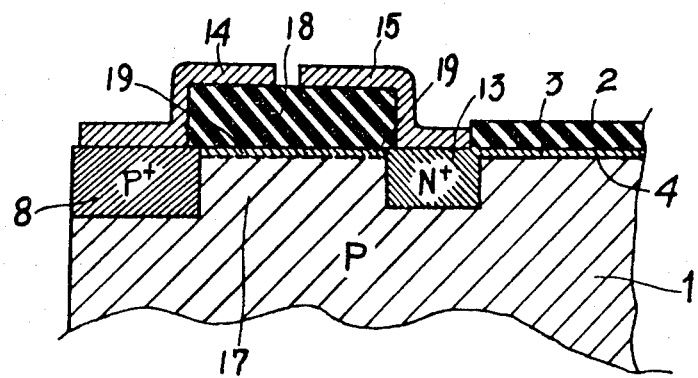
FIG. 3
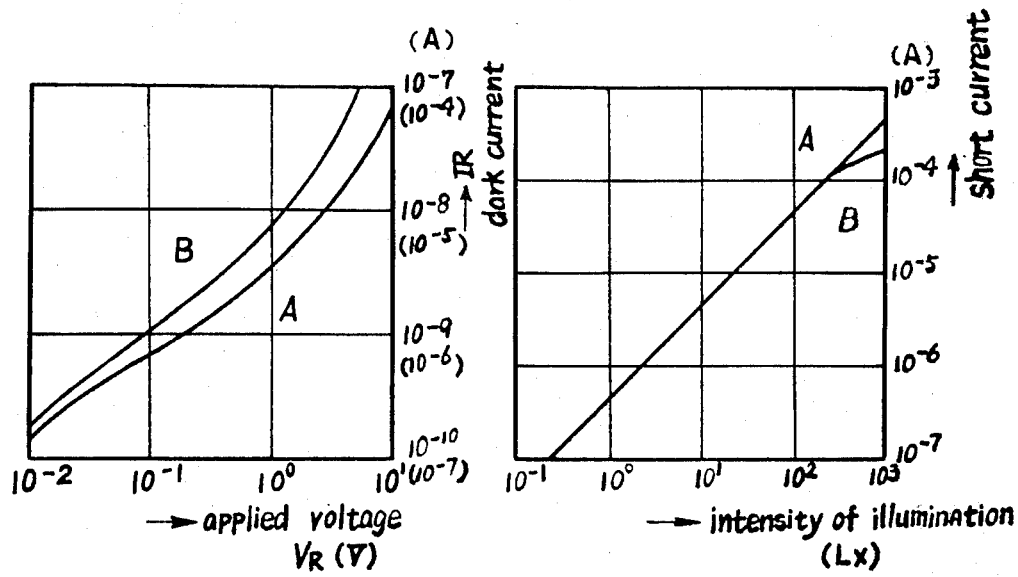
FIG. 6
FIG. 7

CHANNEL TYPE PHOTO-ELECTRIC ENERGY TRANSDUCER

BACKGROUND OF THE INVENTION

The present invention relates to a photo-electric energy transducing semiconductor device which exhibits improved operating characteristics.

In the process of growing an oxide on a P type doped silicon, the interfacial portion between the oxide and the silicon semiconductor shows the P to N conductivity inversion behavior and thus results in an extremely shallow PN junction barrier between the oxide layer and the silicon semiconductor. This is due to the well known fact that unsaturated combination occurs at the interfacial portion by virtue of shortage of oxygen, and thereby positive charges are provided and stabilized thereon which has the property of inducing negative charges at the interfacial portion near the silicon semiconductor. The result is the formation of a PN junction barrier of the depth of about 10A. Application of the thus obtained PN junction device to photo diodes gives some advantages, i.e., remarkable enhancement in sensitivity in visible light and ultraviolet light regions in particular.

While several prior art photodiodes employing the negative charge induced channel have been proposed, satisfactory operating characteristics have not been obtained; dark current is large and series resistance is large and the linear characteristic of short current against illumination intensity is poor.

SUMMARY OF THE INVENTION

It is, therefore, an object of the present invention to provide a light energy transducing semiconductor device which has improved operating characteristics specifically reduction in dark current and series resistance.

To achieve the above mentioned object, pursuant to teachings of the present invention, an improvement is provided for a light energy transducing semiconductor device of the type which comprises a P type doped semiconductor wafer and an N type channel formed at the interfacial portion in contact with an oxide grown during the fabrication. In addition to providing a P type heavily doped diffusion well to surround the peripheral portion of the wafer, there is also established an N type heavily doped diffusion well in a manner to completely surround the N type channel and therefore a PN junction barrier in a closed loop. Metal layers operatively associated with the P type and N type diffusion wells are disposed over a dioxide formed between the both wells during the diffusion process.

BRIEF DESCRIPTION OF THE DRAWINGS

The present invention, its features and other objects will be more clearly understood from the following more detailed description taken in conjunction with the drawings in which:

FIG. 3 is an enlarged sectional view of a portion of the energy transducing semiconductor device;

FIG. 6 is a graph plotting dark current against applied voltage;

FIG. 7 is a graph plotting short current against intensity of illumination.

DESCRIPTION OF THE PREFERRED EMBODIMENTS

Figure 2:
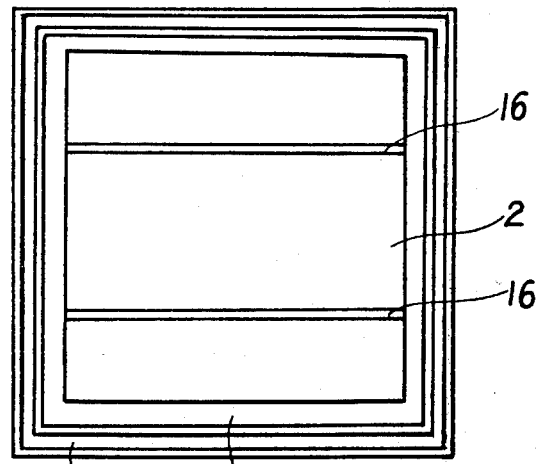
FIG. 2 is a plan view of the energy transducing semiconductor device of FIG. 1.
Figure 1:
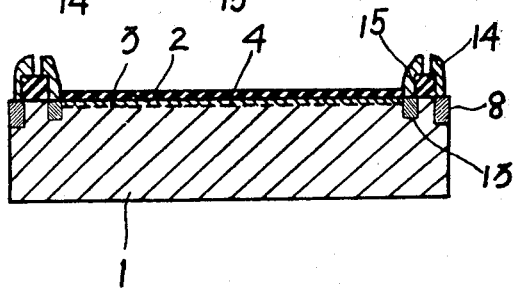
FIG. 1 is a sectional view of an energy transducing semiconductor device constructed in accordance with teachings of the present invention.

Referring to FIGS. 1 through 3, the important aspects of the present invention reside in a special arrangement of an N type heavily doped diffusion well (i.e., N+ region) 13, a metal layer 14 associated with a P type heavily doped diffusion well (i.e., P+ region) 8, and a metal layer 15 associated with the N type heavily doped diffusion well 13.

As briefly set forth above, the illustrative semiconductor device includes a semiconductor wafer 1 of P type doped silicon, silicon dioxide layer 2 formed by surface oxidation, an N type channel region 3 established by the formation of the dioxide 2, and a PN junction barrier 4 established between the P type wafer 1 and the N type channel 3. The P type and N type heavily doped regions 8, 13 operatively associated with the P type wafer 1 and the N type channel 3 are fabricated by conventionally utilizing the technique of oxide masking and solid state diffusion. The impurity concentrations of the respective regions may be optionally selected. However, the diffusion regions 8, 13 should have the impurity concentration higher than that of the wafer 1. In a given example, the concentration of the N inversion channel 3 is about $2 \times 10^{12} \text{cm}^{-2}$. While the P type wafer 1 has the impurity concentration of about $2 \times 10^{15} \text{cm}^3$, the heavily doped regions 8, 13 have the impurity concentration on the order of $10^{20-21} \text{cm}^3$.

It is to be understood that within the present semiconductor device the $N^{30}$ diffusion region 13 is of the closed loop or endless shape, disposed inside of the P+ diffusion region 8, whereby it surrounds completely the N type channel region 3.

Besides, over a dioxide 18 established on an area 17 which is defined by the P+ and N+ diffusion regions 8, 13 during the diffusion step, there are disposed metal layers 14, 15 of a proper electrode material, for example, aluminium, keeping an isolation spacing therebetween. This results in an overlying metal layer structure. In other words, the dioxide 18 is overlaid with the metal layers 14, 15.

The dioxide 18 is a mask available during the fabrication of the P+ and N+ diffusion regions 8, 13. Briefly speaking, prior to the formation of the N type channel region 3, an oxide (not shown) is disposed over the entire surface of the semiconductor wafer 1 and P+ and N+ diffusion procedures are carried out through mask windows. Thereafter, a portion of the dioxide is removed for exposure of a light sensitive or active surface, and a subsequent surface oxidation is performed to dispose the new oxide 3 at the active surface in order to create the N type channel 3 and hence the PN junction barrier 4.

With such an arrangement, the present semiconductor device may provide the advantages of minimizing or reducing dark current and series resistance for the following reasons.

While the dioxide 18 is made as a diffusion mask in fabricating the P+ region 8 and the N+ region 13, a separate N type channel 19 as shown in FIG. 3 will be necessarily developed at the interfacial portion in contact with the wafer 1 for the same reasons as in the case of the N channel 3 (that is, the positive charge behavior).

Nevertheless, providing that the metal layers 14, 15 have the extensions over the dioxide 18, the interfacial portion beneath the dioxide 18 will exhibit a reduced concentration and therefore current leakage through that portion will be eliminated or minimized.

That is to say, moisture ($H_2O$) is added between the aluminum layers 14, 15 and the dioxide 18 in the process of the fabrication procedure up to completion of the metal deposition. The $H_2$ component in $H_2O$ is advanced into the interior of the dioxide 18 during the aluminum sinter step, thereby serving to cancel the positive charges which are the cause of producing the N channel 19. Thus, it follows that the concentration of the N channel region 19 is remarkably decreased. The O component reacts with the aluminum during the sinter step. By virtue of these behaviors, current leakage between the P+ region 8 and the N channel 19 is substantially avoided. Dark current through the semiconductor device is, therefore, dependent upon only current leakage between the P type wafer 1 and the N-channel 3.

Since the looped N+ region 13 is formed in a manner to surround the active surface or the PN junction barrier, series resistance across the active surface and the metal layer 15 also is reduced. N+ diffusion layers 16 (FIG. 2) of a strip or grid alignment are provided for the purpose of further reducing the series resistance.

Figure 5:
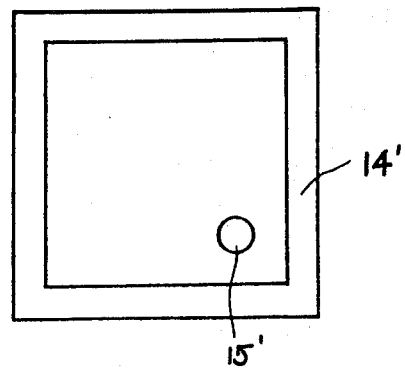
FIGS. 4 and 5 are sectional and plan views of a prior art semiconductor device.
Figure 4:
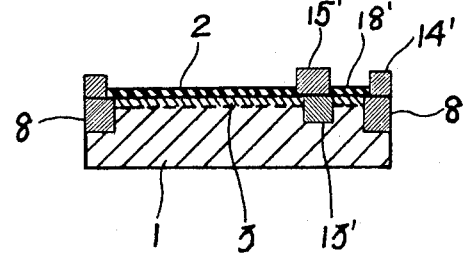

To facilitate understanding of the structural features of the semiconductor device of the present invention, a typical example of a prior art device is shown in FIGS. 4 and 5, wherein the N type heavily doped diffusion layer 13 is formed at only a small point area and thus does not have the looped structure in a manner to surround the active surface. It will be also noted that the dioxide 18' is not overlaid with the metal layers 14', 15'.

FIG. 6 is a graph plotting dark current $I_R$ against applied voltage $V_R$ for comparison between the present device shown in FIGS. 1 through 3 and the best prior art equivalent shown in FIGS. 4 and 5. The curve A shows the characteristic of the present device, whereas the curve B shows that of the prior art device. It will be clear from the graph of FIG. 6 that dark current through the present device is about $10^3$ times smaller than the dark current in the prior art device. Thus, the invented device enables increase in the signal-to-noise ratio and accurate photometry in faint illumination regions.

FIG. 7 is a graph plotting short current $I_{sh}$ against intensity of illumination $L_x$. As shown by the curve A, the present device exhibits the fully linear characteristic of short current against incident light energy up to 1000 lux. This is due to reduction of series resistance.

From the above description of the invention it will be seen that the basic concept of the applicant's invention is making use of P type and N type heavily doped region of the looped structure within the channel type light transducing devices. The techniques of the present invention are applicable to many types of energy transducing devices other than that described above, and many modifications may be made to these specific embodiments without departing from the spirit and scope of the invention.

I claim:

1. An energy transducing semiconductor device comprising:
    a semiconductor wafer of one conductivity type;
    a first channel region of the other conductivity type opposite to that of the semiconductor wafer;
    a junction barrier disposed between the wafer and the first channel region;
    a first oxide disposed over the first channel region to protect the junction barrier against the outside ambient atmosphere;
    a heavily doped first region having the same conductivity as that of the wafer, disposed so as to surround the peripheral portion of the wafer;
    a heavily doped second region having the same conductivity as that of the first channel region, disposed so as to surround the peripheral portion of the junction barrier, the heavily doped second region having a looped structure inside of the heavily doped first region so as to define a closed loop, said heavily doped second region having a looped structure having at least one conductive bridging portion extending from one point on said looped structure to another point thereon disposed over the first oxide;
    a second oxide disposed over the wafer in the space between the heavily doped first section and the heavily doped second region;
    a second channel region of the same conductivity type as the first channel region disposed between the second oxide and the wafer, said second channel region being of such low concentration that leakage current between it and the heavily doped first region surrounding the peripheral portion of the wafer is substantially avoided, whereby dark current through the semiconductor device is determined only by leakage current between the wafer and the first channel region;
    a first metal layer operatively associated with the heavily doped first region, having an extension over the second oxide;
    a second metal layer operatively associated with the heavily doped second region, having an extension over the second oxide;
    the first and second metal layers being disposed so as to have an isolation gap therebetween;
    whereby the second oxide is overlaid with the first and second metal layers which have an isolation gap therebetween.

2. An energy transducing semiconductor device as set forth in claim 1, wherein the semiconductor wafer is silicon and the first and second oxides are silicon dioxide.

3. An energy transducing semiconductor device as set forth in claim 1 wherein the metal layers are made of aluminum.

4. An energy transducing semiconductor device as set forth in claim 1 wherein the N type heavily doped diffusion region having a closed looped structure has said looped structure bridged by at least one strip of the same N type material, disposed over the first oxide.

* * * * *